(12) United States Patent
Ohara et al.

(10) Patent No.: US 12,735,802 B2
(45) Date of Patent: Sep. 15, 2026

(54) QUARTZ GLASS CRUCIBLE, MANUFACTURING METHOD THEREOF, AND MANUFACTURING METHOD OF SILICON SINGLE CRYSTAL

(71) Applicant: SUMCO Corporation, Tokyo (JP)

(72) Inventors: Masami Ohara, Akita (JP); Hiroshi Kishi, Akita (JP); Eriko Kitahara, Akita (JP); Hideki Fujiwara, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 253 days.

(21) Appl. No.: 18/290,514

(22) PCT Filed: Feb. 9, 2022

(86) PCT No.: PCT/JP2022/005165
§ 371 (c)(1),
(2) Date: Nov. 14, 2023

(87) PCT Pub. No.: WO2022/249570
PCT Pub. Date: Dec. 1, 2022

(65) Prior Publication Data
US 2024/0254651 A1 Aug. 1, 2024

(30) Foreign Application Priority Data
May 25, 2021 (JP) ............................ JP2021-087313

(51) Int. Cl.
*C30B 15/10* (2006.01)
*C03C 17/00* (2006.01)
*C30B 29/06* (2006.01)

(52) U.S. Cl.
CPC ............ *C30B 15/10* (2013.01); *C03C 17/004* (2013.01); *C30B 29/06* (2013.01); *C03C 2201/02* (2013.01)

(58) Field of Classification Search
CPC . C03B 19/095; C03B 2201/03; C03C 17/004; C03C 2201/02; C30B 15/10; C30B 29/06; C30B 35/002
See application file for complete search history.

(56) References Cited

U.S. PATENT DOCUMENTS 6,363,098 B1 3/2002 Hagihara et al.
2010/0319609 A1* 12/2010 Sato ........................ C30B 29/06 117/208

(Continued)

FOREIGN PATENT DOCUMENTS

CN 103482995 A * 1/2014 ............. C04B 35/83
DE 10048368 A1 5/2001

(Continued)

OTHER PUBLICATIONS

Office Action for JP App. No. 2021-087313, dated Jul. 23, 2024 (w/ translation).

(Continued)

*Primary Examiner* — Hua Qi
(74) *Attorney, Agent, or Firm* — GREENBLUM & BERNSTEIN, P.L.C.

(57) ABSTRACT

A quartz glass crucible includes a crucible base body including silica glass and a coating film containing a crystallization accelerator and formed on the inner surface of the crucible base body. The average carbon concentration in the coating film, and the crucible base body within a range of 0 μm or more and 300 μm or less in depth from the inner surface of the crucible base body is $1.0\times10^{12}$ atoms/cc or more and $3.0\times10^{19}$ atoms/cc or less.

7 Claims, 7 Drawing Sheets

(56) References Cited

U.S. PATENT DOCUMENTS

| | | | | |
|---|---|---|---|---|
| 2011/0240663 | A1 | 10/2011 | Yamagata et al. | |
| 2012/0006254 | A1* | 1/2012 | Fujishiro | C03B 19/095 117/208 |
| 2012/0308678 | A1 | 12/2012 | Hayashi et al. | |
| 2014/0150715 | A1 | 6/2014 | Yamagata | |
| 2019/0145019 | A1 | 5/2019 | Kishi et al. | |
| 2020/0115820 | A1* | 4/2020 | Kishi | C03B 20/00 |

FOREIGN PATENT DOCUMENTS

| | | | |
|---|---|---|---|
| DE | 102012011793 | A1 | 12/2013 |
| JP | H4-349191 | A | 12/1992 |
| JP | 2002-80230 | A | 3/2002 |
| JP | 2003-160393 | A | 6/2003 |
| JP | 2009-102206 | A | 5/2009 |
| JP | 2011-32147 | A | 2/2011 |
| JP | 2011-079681 | A | 4/2011 |
| JP | 2012-91969 | A | 5/2012 |
| JP | 2012-211082 | A | 11/2012 |
| JP | 2017-065962 | A | 4/2017 |
| JP | 2018-138508 | A | 9/2018 |
| JP | 2018-145079 | A | 9/2018 |
| JP | 2019-64882 | A | 4/2019 |
| JP | 2020-161714 | A | 10/2020 |
| KR | 10-2019-0004739 | A | 1/2019 |
| TW | 200936820 | A | 9/2009 |
| TW | 201348157 | A | 12/2013 |
| WO | WO 2011/111669 | A1 | 9/2011 |
| WO | WO 2013/171955 | A1 | 11/2013 |

OTHER PUBLICATIONS

OA for DE App. No. 112022002801.7, dated Jul. 21, 2025 (w/ translation).

Son, et al., “Measurement and Analysis of Adhesion Property of Lithium-Ion Battery Electrodes with SAICAS”, ACS Applied Materials & Interfaces, 6(1):526-531, (2013).

Office Action for KR App. No. 10-2023-7036528, dated Mar. 21, 2024 (w/ translation).

ISR for PCT/JP2022/005165, dated Apr. 12, 2022 (w/ translation).

U.S. Appl. No. 18/290,547 to Ohara et al., filed Nov. 14, 2023.

* cited by examiner

QUARTZ GLASS CRUCIBLE, MANUFACTURING METHOD THEREOF, AND MANUFACTURING METHOD OF SILICON SINGLE CRYSTAL

TECHNICAL FIELD

The present invention relates to a quartz glass crucible and a manufacturing method thereof, and particularly to a quartz glass crucible used for pulling up a silicon single crystal by the Czochralski method (CZ method). In addition, the present invention relates to a manufacturing method of a silicon single crystal using such a quartz glass crucible.

BACKGROUND ART

Most of silicon single crystals are manufactured by the CZ method. In the CZ method, a polycrystalline silicon raw material is melted in a quartz glass crucible to generate a silicon melt, a seed crystal is immersed in the silicon melt, and the seed crystal is gradually pulled up while rotating the quartz glass crucible and the seed crystal. Thus, a large single crystal is grown at the lower end of the seed crystal. According to the CZ method, it is possible to increase a yield of large-diameter silicon single crystals.

A quartz glass crucible is a silica glass container for holding a silicon melt during the pulling up step of the silicon single crystal. Therefore, the quartz glass crucible is required to have high durability to withstand a long duration use without being deformed at high temperature not less than the melting point of silicon. In addition, the quartz glass crucible is required to have high purity for preventing impurity contamination of the silicon single crystal.

It is known that a brown ring-shaped crystal of cristobalite, which is called brown ring, grows on the inner surface of the quartz glass crucible that comes into contact with the silicon melt when the silicon single crystal is pulled up. When the brown ring is peeled from the surface of the crucible and mixed into the silicon melt, it may be transported to the solid-liquid interface by melt convection and incorporated into the single crystal. Peeling of cristobalite causes dislocation in the silicon single crystal. Therefore, the inner surface of the crucible is actively crystallized by a crystallization accelerator to prevent the peeling of the crystal pieces.

It is known that carbon, which is an impurity in a silicon single crystal, accelerates oxygen precipitation and adversely affects device properties such as current leakage. Therefore, it is desirable that the carbon concentration of the silicon single crystal is as low as possible. Since the carbon element present in the vicinity of the inner surface of the quartz glass crucible is directly incorporated into the silicon melt when the polycrystalline silicon raw material is melted, it is important to reduce the carbon concentration in the vicinity of the inner surface of the crucible.

Regarding the carbon concentration of a quartz glass crucible, for example, Patent Literature 1 describes a quartz glass crucible in which the inner surface layer has a nitrogen content of 100 to 4,000 ppm and a carbon content of 30 to 1,000 ppm. The object of this quartz glass crucible is to positively supply nitrogen and carbon to the silicon melt from the crucible side, and thus the crucible contains nitrogen and carbon at high concentrations.

Patent Literature 2 describes a manufacturing method of a silica container including a step of forming a preliminarily molded base body in a predetermined shape, in which base body's raw material powder (silica powder) are introduced into the inner wall of the outer frame while rotating the outer frame having holes for decompression, and a step of forming the silica base body, in which the preliminarily molded base body is decompressed from an outer peripheral side thereof with adjusting the humidity inside the outer frame by ventilating the gas present in the outer frame with supplying, from the inside of the preliminarily molded base body, a mixed gas containing $O_2$ gas and an inert gas and dehumidified to predetermined dew point temperature or lower, and at the same time heated from the inside of the preliminarily molded base body by a discharge-heat melting method using a carbon electrode, thereby making an outer peripheral part of the preliminarily molded base body to a sintered body while an inner part of the preliminarily molded base body to a molten glass body. With this manufacturing method, the amount of carbon (C) contained in the manufactured silica base body can be extremely reduced by oxidizing and gasifying the carbon particles scattered from the carbon electrode.

Patent Literature 3 describes, firing silica gel particles manufactured by a wet method is preferably particle-sintered at a temperature of the dehydroxylation temperature or more and less than the particle sintering temperature under the atmosphere to obtain synthetic quartz particles, and then firing the synthetic quartz particles at a temperature of the decarburization temperature or more and less than the particle sintering temperature under a vacuum with a vacuum degree of 100 Pa or less and preferably 50 Pa or less, to manufacture an amorphous synthetic quartz particles having a small amount of residual carbon and a synthetic quartz crucible using the synthetic quartz particles. Since the quartz crucible is manufactured using the synthetic quartz particles having a small amount of residual carbon thus obtained, the carbon concentration in the quartz crucible can be reduced.

Patent Literature 4 describes a silica glass crucible forming a cristobalite layer that has a low impurity concentration of at least carbon, provides a high-quality crystal that can be expected to have a relatively long lifetime, and is less prone to cracking, and a manufacturing method of the silica glass crucible. In this silica glass crucible, a bubble-free silica glass layer having a predetermined thickness has been formed on its inner surface in advance. In the manufacture of such a crucible, the surface of the bubble-free silica glass layer is coated with a hydroxide of an alkaline earth metal element selected from barium (Ba) or the like, and the outer surface of the silica glass crucible is coated with the same material as the inner. Thereafter, heat treatment is performed in an inert gas atmosphere or the like to form a cristobalite layer on the surface coated with the hydroxide. In a case where the ionic radius of the alkaline earth metal is denoted as Ri (Å), the concentration Ci (ppma) of the alkaline earth metal satisfies the relational expression $Ci \geq 5.4E4/|1-(Ri/0.42)^3|$ in any part of the cristobalite layer after the heat treatment.

BACKGROUND ART LITERATURE

Patent Literature

Patent Literature 1: Japanese Patent Laid-open Publication No. H04-349191

Patent Literature 2: Japanese Patent Laid-open Publication No. 2011-032147

Patent Literature 3: Japanese Patent Laid-open Publication No. 2002-080230

Patent Literature 4: Japanese Patent Laid-open Publication No. 2018-138508

SUMMARY OF INVENTION

Problems to be Solved by the Invention

However, even in a case where a silicon single crystal is pulled up using a conventional quartz glass crucible with a reduced carbon concentration, the carbon concentration of the silicon single crystal may increase, and an improvement is required. In the so-called multi-pulling up, in which a plurality of silicon single crystals are pulled up from the same crucible by additionally charging the polycrystalline silicon raw material, the carbon concentration tends to increase due to the effect of segregation as the number of pulling up increases, and thus the issue of carbon concentration in a silicon single crystal is remarkable.

Accordingly, an object of the present invention is to provide a quartz glass crucible capable of reducing carbon contamination and the rate of pinhole formation in a silicon single crystal, and a manufacturing method of the quartz glass crucible. Another object of the present invention is to provide a manufacturing method of a silicon single crystal using such a quartz glass crucible.

Means for Solving the Problems

The inventors of the present application conducted extensive research to reduce the carbon concentration in a silicon single crystal grown by the CZ method, and found that in a case where a crystallization accelerator is applied to the inner surface of a quartz glass crucible, it is necessary to reduce the carbon concentration in the coating film containing the crystallization accelerator in addition to reducing the carbon concentration in the crucible base body consisting of silica glass, thereby the carbon concentration in the silicon single crystal can be reduced.

The present invention is based on such technical findings, and a quartz glass crucible according to the present invention includes a crucible base body consisting of silica glass and a coating film containing a crystallization accelerator and formed on the inner surface of the crucible base body, in which an average carbon concentration in the coating film and the crucible base body within a range of 0 μm or more and 300 μm or less in depth from the inner surface thereof is $1.0\times10^{12}$ atoms/cc or more and $3.0\times10^{19}$ atoms/cc or less.

In the quartz glass crucible according to the present invention, the carbon concentration in the coating film containing the crystallization accelerator is reduced as well as in the vicinity of the inner surface of the crucible base body, and thus the carbon concentration in the silicon single crystal grown by the CZ method can be reduced.

In the present invention, the weight ratio of a carbonate occupied in the coating film is preferably 20.0 w % or less. In a case where the weight ratio of the carbonate in the coating film is 20.0 w % or less, the average carbon concentration in the coating film can be $3.0\times10^{19}$ atoms/cc or less. The weight ratio of the carbonate can be measured by the XPS method or the Raman measurement method.

In the present invention, the average carbon concentration in the coating film is preferably $3.0\times10^{18}$ atoms/cc or less, the average carbon concentration in the coating film, and the crucible base body within the range of 0 μm or more and 300 μm or less in depth from the inner surface thereof is more preferably $1.3\times10^{16}$ atoms/cc or less. Furthermore, the average carbon concentration in the crucible base body within the range of 300 μm or more and 2,000 μm or less in depth from the inner surface of the crucible base body is preferably $1.1\times10^{19}$ atoms/cc or less. Thereby, the carbon concentration in the silicon single crystal can be further reduced.

In the present invention, the variation coefficient (σ/AVERAGE) of the carbon concentration in the coating film at five points on the bottom of the crucible base body is preferably 1.1 or less. Here, the five points are preferably determined as a first measurement point that is a center of the bottom, a second measurement point that is a position shifted by 0.08 to 0.7 times a radius in a radial direction of the crucible base body from the first measurement point, a third measurement point that is a position rotated 90° clockwise in a circumferential direction from the second measurement point, a fourth measurement point is a position rotated 90° clockwise in the circumferential direction from the third measurement point, and a fifth measurement point that is a position rotated 90° clockwise in the circumferential direction from the fourth measurement point. The bias of the carbon concentration on the inner surface of the crucible causes pinhole formation in the silicon single crystal. However, by reducing the in-plane variation in the carbon concentration in the coating film formed in the bottom central region of the crucible, the pinhole formation can be prevented.

The coating film preferably has a peel strength of 0.3 kN/m or more. In a case where the coating film has a peel strength of 0.3 kN/m or more, surface roughening of the inner surface of the crucible and peeling of the brown ring can be suppressed, and dislocation in the silicon single crystal can be prevented.

The nitrogen concentration in the coating film and the crucible base body within the range of 0 μm or more and 300 μm or less in depth from the inner surface thereof is preferably $4.7\times10^{17}$ atoms/cc or less. By reducing the nitrogen concentrations in the vicinity of the inner surface of the crucible base body and in the coating film, the amount of nitrogen incorporated into the silicon single crystal can be reduced. Therefore, it is possible to prevent the occurrence of unintended oxygen precipitation-induced defects in the silicon single crystal.

In addition, the manufacturing method of a quartz glass crucible according to the present invention includes a step of producing a crucible base body consisting of silica glass, and a step of applying a coating liquid containing a crystallization accelerator on an inner surface of the crucible base body to form a coating film of the crystallization accelerator, in which the step of producing the crucible base body includes arc melting of silica powder having a carbon content of less than 6 ppm and used as a raw material for the inner surface of the crucible base body, using a carbon electrode having bulk specific gravity of 1.50 g/cc or more and 1.75 g/cc or less and specific resistivity of 330 μΩ·cm or more and 600 μΩ·cm or less, and the crystallization accelerator is a compound of an element (Mg, Ca, Sr, or Ba) in the group 2a, which has no carbon atoms in a molecule.

$CO_2$ gas is generated by oxidative wear of the carbon electrode from the surface during arc melting. In a case where a specific gravity or a specific resistivity of the electrode is large, carbon particles may scatter from the surface and be incorporated into the crucible before they are burned out by the arc heat. However, in the manufacturing method of a quartz glass crucible according to the present invention, carbon electrodes having relatively low specific gravity and specific resistivity are used, and thus such issue can be solved and the carbon concentration in the vicinity of the inner surface of the crucible base body can be reduced.

In the manufacturing method of a quartz glass crucible according to the present invention, it is preferable that before forming the coating film of the crystallization accelerator, the crucible base body is cleaned with hydrofluoric acid of semiconductor grade or higher and pure water. Thereby, it possible to efficiently remove impurities including carbon adhered to the surface of the crucible base body.

The crystallization accelerator is preferably a water-soluble compound. Thereby, the solubility in water is high and the aqueous solution can be easily handled, and thus uniform application of the crystallization accelerator to the crucible surface can be easily achieved.

In the step of forming the coating film, the application of the coating liquid is preferably performed while heating the crucible base body at a temperature of 60° C. or more and 500° C. or less, and more preferably heating at a temperature of 100° C. or more and 180° C. or less. In this case, the applying of the coating liquid is preferably performed while heating the crucible base body such that a difference between a boiling point of a solvent in the coating liquid and a temperature of the crucible base body is −40.0° C. or more and 100° C. or less, and it is more preferable to set the heating temperature of the crucible base body to the boiling point of the solvent or more and 80° C. or less. Thereby, it is possible to suppress the generation of a carbonate and to reduce the carbon concentration in the coating film.

In the step of applying the coating liquid, the coating liquid is preferably sprayed using a two-fluid nozzle that mixes gas and liquid at a spray tip and sprays the mixture, and the spraying of the coating liquid is preferably performed under a low vacuum of $1\times10^2$ Pa or more and $1\times10^5$ Pa or less. By applying the coating liquid to the heated crucible base body under a low vacuum in this way, it is possible to instantly evaporate the solvent and to uniformly fix the crystallization accelerator, and unevenness in the coating film due to liquid dripping of the coating liquid on the crucible surface, or the like can be prevented. In addition, since the solvent can be evaporated in a short time to shorten the heating time, the generation of a carbonate can be suppressed.

In the step of forming the coating film, it is preferable that the maximum thickness of the coating film formed by one applying is set to 0.5 μm or less, and the coating film is formed into multiple layers by alternately repeating drying of the coating film and reapplying. Thereby, a dense and uniform coating film can be formed, and the peel strength of the coating film can be increased.

The spray amount of the coating liquid is preferably 300 mL/min or less. Thus, by suppressing the spray amount of the coating liquid to 300 mL/min or less, a dense coating film can be uniformly formed.

Furthermore, in the manufacturing method of a silicon single crystal according to the present invention, a silicon single crystal is pulled up using the quartz glass crucible according to the present invention having the above-described features. According to the present invention, silicon crystals with reduced carbon contamination and the reduced rate of pinhole formation can be manufactured.

Effects of the Invention

According to the present invention, it is possible to provide a quartz glass crucible capable of reducing carbon contamination and the rate of pinhole formation in a silicon single crystal, and a manufacturing method of the quartz glass crucible. In addition, according to the present invention, it is possible to provide a manufacturing method of a silicon single crystal using such a quartz glass crucible.

MODE FOR CARRYING OUT THE INVENTION

Hereinafter, preferred embodiments of the present invention are described in detail with reference to the accompanying drawings.

Figure 1:
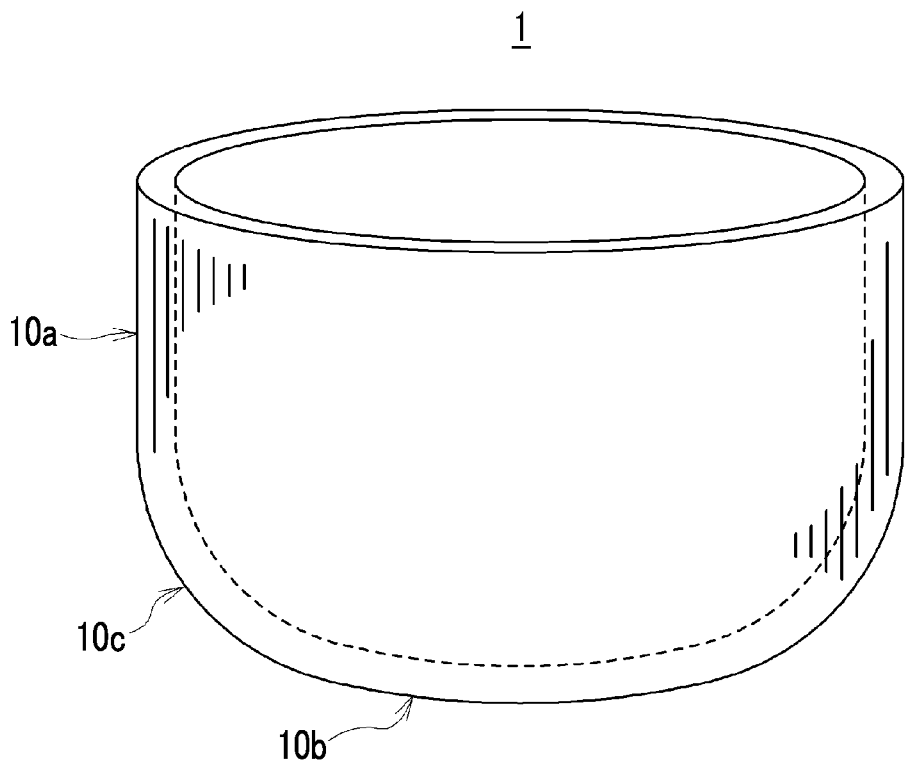
FIG. 1 is a schematic perspective view illustrating a configuration of a quartz glass crucible according to an embodiment of the present invention.

FIG. 1 is a schematic perspective view illustrating the configuration of a quartz glass crucible according to an embodiment of the present invention. In addition, FIG. 2 is a schematic side sectional view and a partially enlarged view of the quartz glass crucible illustrated in FIG. 1.

Figure 2:
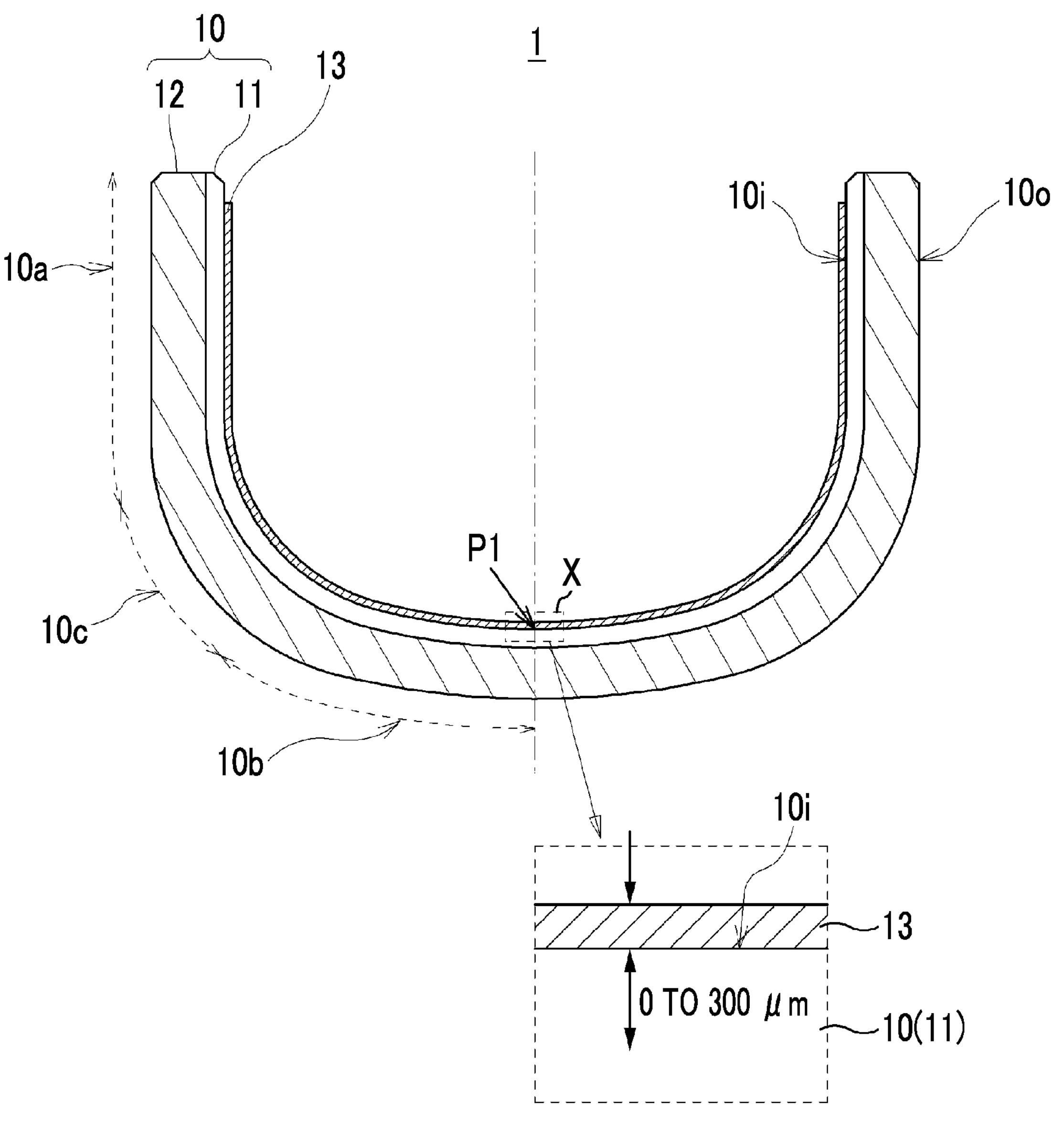
FIG. 2 is a schematic side sectional view and a partially enlarged view of the quartz glass crucible illustrated in FIG. 1.

As shown in FIG. 1 and FIG. 2, a quartz glass crucible 1 is a silica glass container for holding a silicon melt and has a cylindrical sidewall 10*a*, a bottom 10*b* provided below the sidewall 10*a*, and a corner 10*c* provided between the sidewall 10*a* and the bottom 10*b*. The bottom 10*b* is preferably a so-called round bottom that is gently curved, but may also be a so-called flat bottom. The corner 10*c* is a portion having a larger curvature than the bottom 10*b*.

The aperture (diameter) of the quartz glass crucible 1 also varies depending on the diameter of the silicon single crystal ingot that is pulled up from the silicon melt, but is 18 inches (approximately 450 mm) or more, preferably 22 inches (approximately 560 mm), and particularly preferably 32 inches (approximately 800 mm) or more. This is because such a large crucible is used for pulling up a large silicon single crystal ingot having a diameter of 300 mm or more, and is required not to affect the quality of the single crystal even with the long duration use.

The wall thickness of the crucible varies slightly depending on its part, but it is preferable that the wall thickness of the sidewall 10*a* of the crucible of 18 inches or more is 6 mm or more, and the wall thickness of the sidewall 10*a* of the crucible of 22 inches or more is 7 mm or more, and the wall thickness of the sidewall 10*a* of the crucible of 32 inches or more is 10 mm or more. As a result, a large amount of silicon melt can be stably held at high temperature.

As shown in FIG. 2, a quartz glass crucible 1 includes a crucible base body 10 consisting of silica glass and a coating film 13 of a crystallization accelerator and formed on the inner surface 10*i* of the crucible base body 10. The crucible base body 10 mainly has a two-layer structure, and has a transparent layer 11 containing no bubbles (non-bubble layer) and a bubble layer 12 containing a large number of minute bubbles (opaque layer), and the coating film 13 is provided inside the transparent layer 11.

The transparent layer 11 is a layer that configures the inner surface 10*i* of the crucible base body 10, which comes into contact with the silicon melt, and is provided to prevent a yield of the silicon single crystals from decreasing due to bubbles in the silica glass. Since the inner surface 10*i* of the crucible reacts with the silicon melt to melt away, the bubbles in the vicinity of the inner surface of the crucible cannot be trapped in the silica glass and the bubbles burst due to thermal expansion, and thus the crucible fragments (silica fragments) may be peeled. In a case where the crucible fragments released into the silicon melt are transported by melt convection to a growth interface of the silicon single crystal and are incorporated into the silicon single crystal, they cause dislocation in the single crystal. In addition, in a case where the bubbles released into the silicon melt float up and reach a solid-liquid interface and are incorporated into the single crystal, they cause pinhole formation in the silicon single crystal.

Containing no bubbles in the transparent layer 11 means having a bubble content and a bubble size to the extent that the single crystallization rate does not decrease due to bubbles. Such a bubble content is, for example, 0.1 vol % or less, and the bubble diameter is, for example, 100 μm or less.

The thickness of the transparent layer 11 is preferably 0.5 to 10 mm, and is set to an appropriate thickness for each portion of the crucible such that the bubble layer 12 is not exposed by completely vanishing the transparent layer 11 due to melting away during a crystal pulling up step. The transparent layer 11 is preferably provided over the entire crucible from the sidewall 10*a* to the bottom 10*b* of the crucible, but the transparent layer 11 can be omitted at the upper end portion of the crucible that does not come into contact with the silicon melt.

The bubble layer 12 is a principal layer of the crucible base body 10 located on the outer side than the transparent layer 11 and is provided to improve the heat retention property of the silicon melt in the crucible, and to heat the silicon melt in the crucible as uniformly as possible by dispersing radiant heat from a heater in a single crystal pulling apparatus. Therefore, the bubble layer 12 is provided over the entire crucible from the sidewall 10*a* to the bottom 10*b*.

The bubble content of the bubble layer 12 is higher than the transparent layer 11 and is preferably more than 0.1 vol % and 5 vol % or less. This is because in a case where the bubble content of the bubble layer 12 is 0.1 vol % or less, the bubble layer 12 cannot exhibit the required heat retention function. In addition, this is because when the bubble content of the bubble layer 12 exceeds 5 vol %, the crucible may be deformed due to the thermal expansion of the bubbles and decrease the yield of the single crystals, and further heat transfer property is insufficient. From the viewpoint of the balance between the heat retention property and the heat transfer property, the bubble content of the bubble layer 12 is particularly preferably 1 to 4 vol %. The above-mentioned bubble content is a value obtained by measuring the crucible before use under a room temperature environment.

In order to prevent contamination of the silicon melt, the silica glass configuring the transparent layer 11 is preferably of high purity. Therefore, the crucible base body 10 preferably has a two-layer structure of a synthetic silica glass layer (synthetic layer) formed from synthetic quartz powder and a natural silica glass layer (natural layer) formed from natural quartz powder. The synthetic quartz powder can be manufactured by vapor-phase oxidation of silicon tetrachloride ($SiCl_4$) (dry synthesis method) or by hydrolysis of silicon alkoxide (sol-gel method). In addition, the natural quartz powder is manufactured by pulverizing natural minerals containing α-quartz as a main component into granules.

The two-layer structure of a synthetic silica glass layer and a natural silica glass layer can be manufactured by depositing the natural quartz powder along the inner surface of the mold for manufacturing the crucible, depositing the synthetic quartz powder thereon, and melting these raw material quartz powder with Joule heat generated by arc discharge. The arc melting step includes strongly evacuating from outside of the deposited layer of raw material quartz powder to remove bubbles and form the transparent layer 11, stopping or weakening the evacuation to form the bubble layer 12. Therefore, the interface between the synthetic silica glass layer and the natural silica glass layer does not necessarily coincide with the interface between the transparent layer 11 and the bubble layer 12, but the synthetic silica glass layer preferably has, as similar to the transparent layer 11, a thickness to the extent that does not completely vanish due to melting away of the inner surface of the crucible during the single crystal pulling up step.

The quartz glass crucible 1 according to the present embodiment has a configuration in which the inner surface 10*i* of the crucible base body 10 is covered with a coating film 13 of a crystallization accelerator. The crystallization accelerator is a compound of an element (Mg, Ca, Sr, or Ba) in the group 2a and plays a role in accelerating crystallization of the inner surface 10*i* of the crucible base body 10 during the single crystal pulling up step. In the present embodiment, the crystallization accelerator is preferably a hydroxide or oxide having no carbon atoms in the molecule, and particularly preferably a hydroxide that is highly soluble in water and easy to handle. Barium (Ba) is particularly preferred as the element in the group 2a as the crystallization accelerator. This is because barium has a smaller segregation coefficient than silicon, is stable at room temperature, and is easy to handle. In addition, barium has an advantage that the crystallization rate of the crucible is not attenuated with crystallization and orientation growth is induced more strongly than other elements.

The coating film 13 of the crystallization accelerator is formed in a range of 0.25 times or more and 1 time or less a crucible outer diameter. In the present embodiment, the coating film 13 of the crystallization accelerator is preferably formed on the entire inner surface 10*i* of the crucible base body 10 excluding the vicinity of the upper end of the rim. The reason for excluding the vicinity of the upper end of the rim is that the vicinity of the upper end of the rim does not come into contact with the silicon melt and does not necessarily need to be crystallized. This is also because peeling of crystals is occurred in the vicinity of the upper end of the rim during crystallization and thus the crystal pieces mixed in the silicon melt cause dislocations in the silicon single crystal.

The thickness of the coating film 13 is not particularly limited, but is preferably 0.1 to 50 μm and particularly preferably 1 to 20 μm. This is because in a case where the thickness of the coating film 13 is too thin, the peel strength of the coating film is weak, and the peeling of the coating film 13 causes nonuniform crystallization. Also in a case where the coating film 13 is too thick, the peel strength is lowered and the crystallization is nonuniform.

It is preferable that the coating film 13 does not peel, and for this purpose a peel strength of 0.3 kN/m or more is required. The coating film 13 needs to satisfy such peel strength at least in the bottom central region of the crucible base body 10, and preferably satisfies such peel strength over the entire region where the coating film 13 is formed. In this example, the bottom central region of the crucible base body 10 means a region within a range of 0.5 r (r is the outer diameter (radius) of the crucible) from the center of the bottom of the crucible base body 10.

Figure 3:
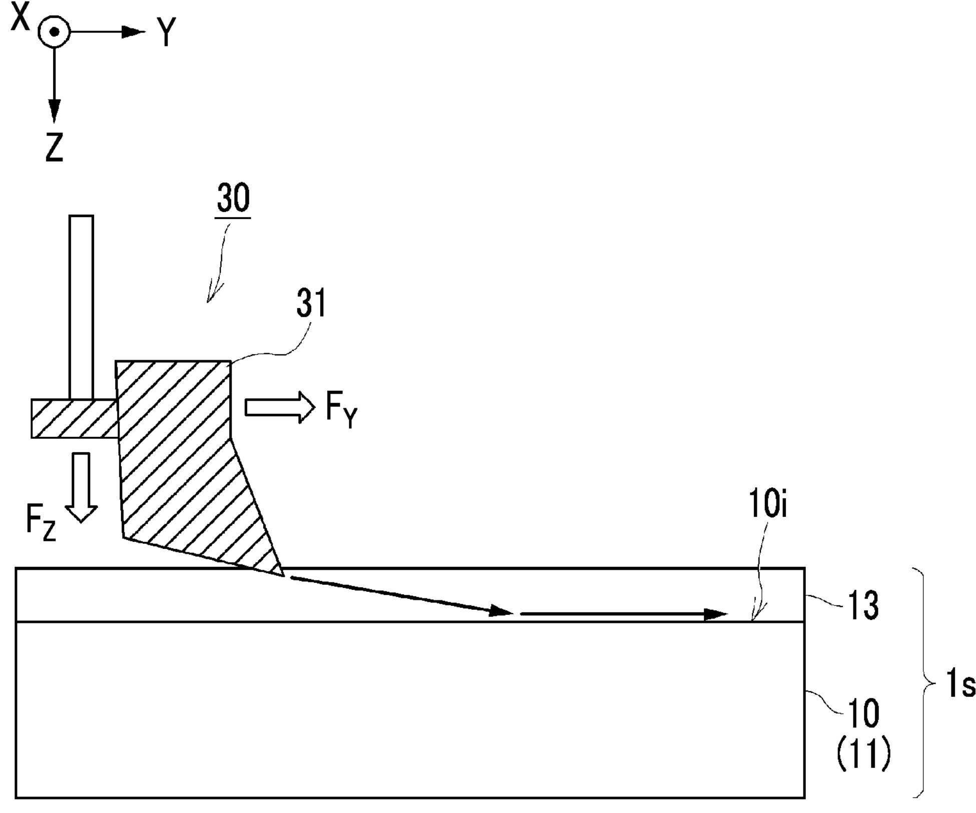
FIG. 3 is a schematic diagram illustrating a method of measuring the peel strength of a coating film.

FIG. 3 is a schematic diagram illustrating a method of measuring the peel strength of a coating film 13.

As shown in FIG. 3, the peel strength of the coating film 13 can be measured using a SAICAS (Surface And Interfacial Cutting Analysis System) 30. The SAICAS 30 can obtain the apparent shear strength from the vertical load $F_Z$ (vertical force) and the horizontal load $F_Y$ (horizontal force) when the diamond blade 31 obliquely cuts the coating, and can obtain the peel strength from the horizontal load $F_Y$ (horizontal force) when the diamond blade 31 parallelly cuts the interface between the coating and base body. The peel strength of the coating film 13 can be obtained from the horizontal load $F_Y$ when a crucible piece sample Is having the coating film 13 formed thereon is placed on a stage and diamond blade 31 cuts the interface (the inner surface 10*i* of the crucible base body 10) between the coating film 13 and the crucible base body 10.

The concentration of the crystallization accelerator contained in the coating film 13 is preferably $2.5\times10^{15}$ atoms/cm$^2$ or more. In this way, in a case where the concentration of the crystallization accelerator is relatively high, even in a case where a portion of the crystallization accelerator is peeled, it is possible to accelerate crystallization in the surface direction and to achieve the uniform crystallization of the inner surface 10*i* of the crucible base body 10.

On the other hand, in a case where the concentration of the crystallization accelerator on the crucible surface is high, the crystallization rate on the crucible surface is high, and crystallization also proceeds in the lateral direction (surface direction), and thus the requirement of the peel strength is alleviated than the case where the concentration is low. Therefore, in a case where the concentration of the crystallization accelerator on the surface of the crucible is higher than $2.6\times10^{15}$ atoms/cm$^2$, the peel strength of the crystallization accelerator may be 0.3 kN/m or more.

The concentration of the crystallization accelerator may also be $2.5\times10^{15}$ atoms/cm$^2$ or less, and the peel strength of the coating film 13 in that case is preferably 0.6 kN/m or more. In a case where the peel strength of the coating film is high, the inner surface 10*i* of the crucible base body 10 can be crystallized reliably without using a high-concentrated crystallization accelerator.

In a case where the concentration of the crystallization accelerator on the surface of the crucible is as low as $2.6\times10^{15}$ atoms/cm$^2$ or less, the crystal nuclei of brown rings cannot be uniformly formed when the crystallization accelerator is peeled, and thus the peel strength of the crystallization accelerator is required to be 0.6 kN/m or more.

In the bottom central region of the crucible base body 10, the peel strength of the coating film 13 is particularly preferably 0.9 kN/m or more. As described above, since the quartz glass crucible 1 is filled with a large amount of polycrystalline silicon raw material and a very large load is applied to the bottom of the crucible, the coating film 13 is likely to be peeled. However, in a case where the coating film 13 on the bottom of the crucible base body 10 has a peel strength of 0.9 kN/m or more, peeling can be prevented even when such a large load is applied.

The surface roughness (Ra) of the coating film 13 is preferably 0.1 μm or more and 0.25 μm or less. This is because in a case where the surface roughness (Ra) of the coating film is greater than 0.25 μm, the coating film is likely to be peeled, and it is difficult to reduce the surface roughness (Ra) of the coating film to less than 0.1 μm in terms of manufacturing.

It is preferable that the carbon concentration in the silicon single crystal grown by the CZ method is as low as possible, and for this purpose the amount of carbon supplied from the quartz glass crucible 1 needs to be as small as possible, particularly the carbon concentration not only in the crucible base body 10 but also in the coating film 13 needs to be paid attention. Therefore, in the quartz glass crucible 1 according to the present embodiment, the average carbon concentration in the coating film 13, and the crucible base body 10 within the range of 0 μm to 300 μm in depth from the inner surface 10*i* of the crucible base body 10 (that is, the surface layer portion of the crucible base body 10) is $1.0\times10^{12}$ atoms/cc or more and $3.0\times10^{19}$ atoms/cc or less. Thereby, the amount of carbon dissolved in the silicon melt from the quartz glass crucible 1 can be reduced, making it possible to manufacture a silicon single crystal having a low carbon concentration.

The average carbon concentration in the coating film 13 is preferably $3.0\times10^{18}$ atoms/cc or less. In a case where the average oxygen concentration in the coating film is $3.0\times10^{18}$ atoms/cc or less, the amount of carbon supplied from the coating film to the silicon melt can be reduced.

Both the average carbon concentration in the coating film 13 and the average carbon concentration in the crucible base body 10 within the range of 0 μm to 300 μm in depth from the inner surface of the crucible base body 10 are preferably $1.3\times10^{16}$ atoms/cc or less. Furthermore, the average carbon concentration in the crucible base body 10 within the range of 300 μm or more and 2,000 μm or less in depth from the inner surface of the crucible base body 10 is preferably $1.1\times10^{19}$ atoms/cc or less. Thereby, a silicon single crystal with a sufficiently low carbon concentration can be manufactured.

The average carbon concentration in the crucible base body 10 within the range of 300 μm to 2,000 μm in depth from the inner surface of the crucible base body 10 may be higher than the average carbon concentration of the surface layer portion within the range of 0 μm to 300 μm, but is preferably $1.1\times10^{19}$ atoms/cc or less.

Variation in the in-plane distribution of carbon concentration on the inner surface of the crucible causes in-plane variation in the thickness of the cristobalite layer formed on the inner surface of the crucible, which causes the peeling of the cristobalite crystals. In particular, in a case where the crystal layer is uneven at the bottom of the crucible, it causes pinhole formation in the silicon single crystal. Therefore, it is desirable that the variation in the in-plane distribution of the carbon concentration is small at the bottom of the crucible.

Figure 4:
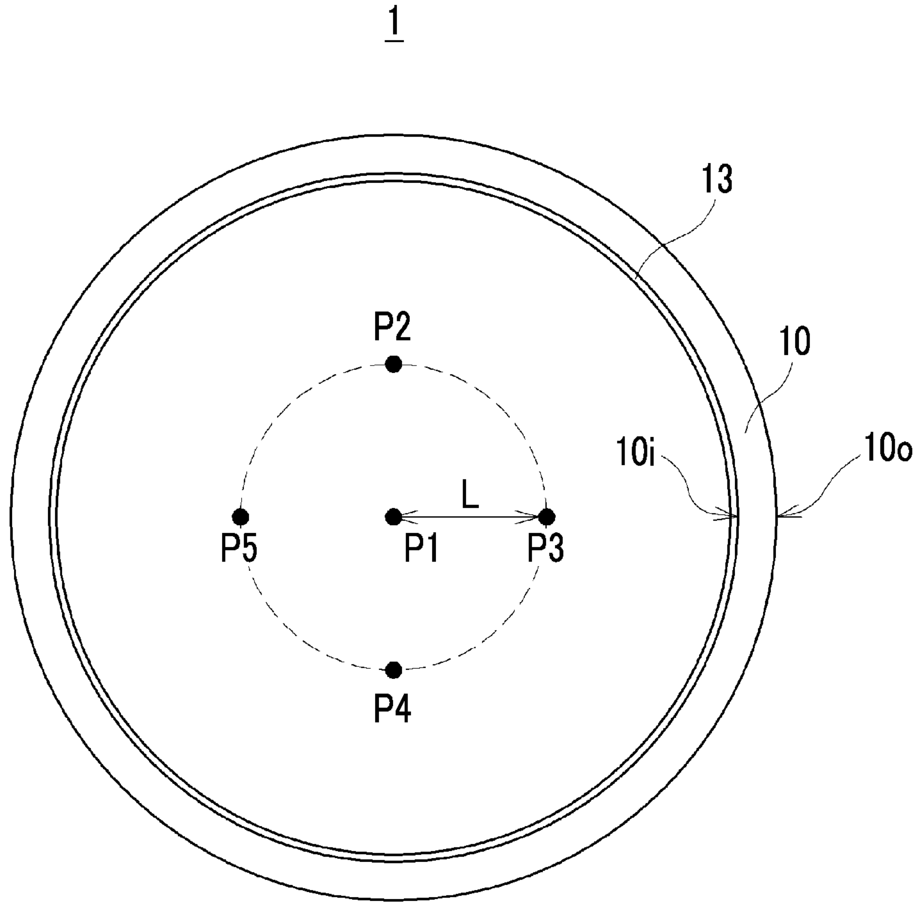
FIG. 4 is a schematic plan view showing the measurement positions of the carbon concentration at the bottom of the crucible.

Specifically, the variation coefficient of is preferably 1.1 or less when measuring the carbon concentration at five points P1 to P5 of the bottom of the crucible. Here, as shown in FIG. 4, the five points of the bottom of the crucible are the center P1 of the bottom and four points P2 to P5 that are the same distance away from the center P1 in four directions. The other four points P2 to P5 other than the center P1 of the bottom are preferably set to be located 0.08 r to 0.7 r (r is the radius of the outer diameter of the crucible base body 10) away from the center P1 (first measurement point) of the bottom of the crucible base body 10 in the radial direction. The third to fifth measurement points P3 to P5 are positions rotated 90° clockwise in the circumferential direction from the second to fourth measurement points P2 to P4, respectively.

The quartz glass crucible 1 according to the present embodiment can be manufactured by applying a crystallization accelerator to the inner surface of the crucible base body 10 after manufacturing the crucible base body 10 by a so-called rotational molding method.

Figure 5:
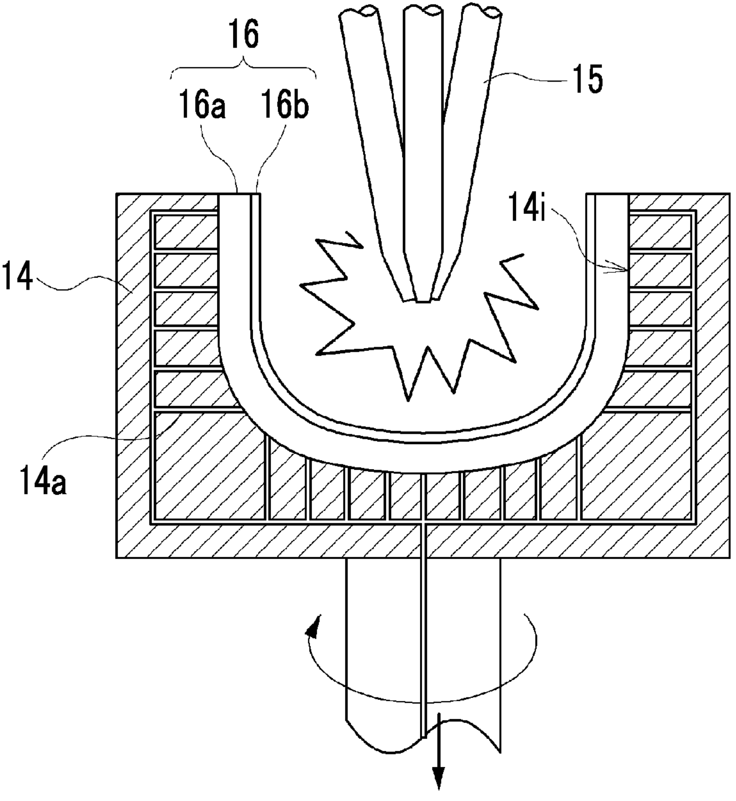
FIG. 5 is a schematic diagram illustrating a manufacturing method of a quartz glass crucible according to a rotational molding method.

FIG. 5 is a schematic diagram illustrating a manufacturing method of the quartz glass crucible according to a rotational molding method.

As shown in FIG. 5, In the rotational molding method, a mold 14 having a cavity matching the outer shape of the crucible is prepared, and the natural quartz powder 16*a* and the synthetic quartz powder 16*b* are sequentially filled along the inner surface 14*i* of the rotating mold 14 to form a deposited layer 16 of raw material quartz powder. The raw material quartz powder stay in a fixed position while sticking to the inner surface 14*i* of the mold 14 by centrifugal force, and are maintained in a crucible shape.

In manufacturing the quartz glass crucible 1, crystalline or amorphous silica powder having a carbon content of less than 6 ppm is prepared, and the quartz glass crucible 1 is manufactured using this silica powder as a raw material in the vicinity of the inner surface. By using silica powder having a very low carbon content as the raw material in the vicinity of the inner surface of the quartz glass crucible, the carbon concentration in the vicinity of the inner surface of the crucible can be reduced.

Next, an arc electrode 15 is installed in the mold 14, and the deposited layer 16 of the raw material quartz powder is arc-melted from the inside of the mold 14. Specific conditions such as heating time and heating temperature are appropriately determined in consideration of the properties of the raw material quartz powder, the size of the crucible, and the like.

In order to reduce the carbon concentration on the inner surface 10*i* of the crucible base body 10, it is preferable to use a carbon electrode having a bulk specific gravity of 1.50 g/cc to 1.75 g/cc and a specific resistivity of 330 μΩ·cm to 600 μΩ·cm as the arc electrode 15. During arc melting, $CO_2$ gas is generated by oxidative wear of the carbon electrode from the surface. In this example, in a case where the specific gravity or specific resistivity of the electrode is lower than the above range, the electrode will be rapidly consumed, thereby generating a large amount of $CO_2$ gas and adversely affecting the shape of the crucible. On the other hand, in a case where the specific gravity or specific resistivity of the carbon electrode exceeds the above range, carbon powder may scatter from the electrode surface and be incorporated into the crucible before they are burned out by the arc heat. However, in the present embodiment, a carbon electrode having a specific gravity and a specific resistivity within the above ranges is used, and thus an increase in $CO_2$ gas and scattering of carbon powder can be suppressed. Therefore, the carbon concentration in the vicinity of the inner surface of the crucible base body 10 can be reduced.

During arc melting, the amount of bubbles in the molten silica glass is controlled by evacuating the deposited layer 16 of raw material quartz powder from a large number of vent holes 14*a* provided on the inner surface 14*i* of the mold 14. Specifically, the transparent layer 11 is formed by evacuating the raw material quartz powder at the start of arc melting, and the bubble layer 12 is formed by stopping the evacuation to the raw material quartz powder after the transparent layer 11 is formed.

Since the arc heat is gradually transferred from the inside to the outside of the deposited layer 16 of the raw material quartz powder to melt the raw material quartz powder, by changing decompression conditions at the timing at which the raw material quartz powder start to melt, the transparent layer 11 and the bubble layer 12 can be made separately. That is, in a case where decompression melting for strengthening the decompression is performed at the timing at which raw material quartz powder melt, arc atmosphere gas is not trapped in the glass, and thus the molten silica becomes silica glass containing no bubbles. In addition, in a case where normal melting (atmospheric pressure melting) for weakening the decompression is performed at the timing at which raw material quartz powder melt, arc atmosphere gas is trapped in the glass, and thus the molten silica becomes silica glass containing a large number of bubbles.

Subsequently, the arc melting is terminated and the crucible is cooled. As described above, the crucible base body 10 is completed, in which the transparent layer 11 and the bubble layer 12 are provided in that order from the inside toward the outside of the crucible wall.

Next, the crucible base body 10 is formed in a predetermined shape by cutting the rim portion, or the like, then cleaned with a cleaning liquid, and further rinsed with pure water. The cleaning liquid is preferably prepared by diluting hydrofluoric acid of semiconductor grade or higher with pure water of TOC≤2 ppb to adjust to 10 to 40 w %.

Next, the crystallization accelerator is applied to the inner surface 10*i* of the crucible base body 10. In order to uniformly disperse the crystallization accelerator on the inner surface 10*i*, a coating liquid is prepared, in which the crystallization accelerator is dissolved in pure water (15° C. to 25° C., 17.2 MΩ or more, and TOC≤2 ppb). At that time, the solution is stirred with a stirrer in order to increase the solubility of the powder of the crystallization accelerator and make the concentration of the solution uniform.

Next, the crucible base body 10 is heated at a temperature of 60° ° C. to 500° ° C. with a halogen heater or clean oven installed in a clean room, and then spraying of the coating liquid with a spray nozzle is performed. When the coating liquid comes into contact with the high-temperature crucible, the solvent instantly evaporates, and the crystallization accelerator component is fixed to the crucible. As described above, the crystallization accelerator is a compound of an element (Mg, Ca, Sr, or Ba) in the group 2a, and in particular, a highly hydrophilic hydroxide thereof is most suitable for enhancing fixability to the crucible.

The hydroxide of an element of the group 2a reacts with carbon dioxide gas in the atmosphere to form carbonate (for example, in a case of barium hydroxide, 2.5% of barium hydroxide becomes barium carbonate). Carbon on the inner surface of the quartz glass crucible is directly incorporated into the silicon melt when a polysilicon is melted. Furthermore, since the carbon element incorporated into the silicon single crystal accelerates oxygen precipitation and affects device performance such as current leakage to reduce the formation of carbonate, it is important that the surface temperature of the crucible is set to 500° C. or less, and preferably 200° C. or less. Furthermore, in order to accelerate evaporation of the solvent, it is preferable to heat the crucible base body 10 such that the difference between the boiling point of the solvent and the temperature of the crucible is −40.0° ° C. to 100° C.

In order to evaporate the solvent in a short time and reduce the formation of carbonate, the heating temperature of the crucible base body 10 is set more preferably to the boiling point of the solvent or more and 80° C. or less. This is because in a case where the temperature of the crucible base body 10 is lower than the boiling point of the solvent, the evaporation time of the solvent becomes long, and the thickness of the coating film and the concentration distribution of the crystallization accelerator become nonuniform, thereby reducing the peel strength of the coating film. In addition, in a case where the evaporation time of the solvent becomes long, condensation of the coating liquid may occur on the surface of the crucible, which may cause the carbon concentration to become high and nonuniform. In a case where the temperature of the crucible base body 10 is 80° C. or less, the carbon concentration in the coating film can be reduced by sufficiently suppressing the generation of carbonate.

In spraying of the coating liquid, a two-fluid nozzle that mixes gas and liquid at a spray tip and sprays the mixture is preferably used and the average droplet diameter is preferably adjusted to 5 μm to 1,000 μm. This is because in a case where the droplet diameter is too large, the fixing of the coating liquid becomes nonuniform, and the uniformity of the coating film deteriorates, resulting in a decrease in peel strength, and in a case where the droplet diameter is too small, the spraying of the coating liquid is difficult. The average droplet diameter is particularly preferably 200 μm or less.

The spray amount of the coating liquid is preferably 300 mL/min or less. This is because in a case where the spray amount of the coating liquid is more than 300 mL/min, the liquid dripping of the coating liquid is likely to occur on the coating surface, making it difficult to uniformly fix the crystallization accelerator.

The spraying of the coating liquid is preferably performed under a low vacuum of $1\times10^2$ Pa to $1\times10^5$ Pa. The evaporation of the solvent is accelerated under low pressure (vacuum), and the crystallization accelerator can be fixed uniformly, thereby the coating film having high peel strength can be formed. In addition, in a case where the solvent is evaporated in a short time, the heating time is shortened, and thus the generation of carbonate can be suppressed.

In the formation of the coating film, it is preferable that the thickness of the crystallization accelerator formed by one application is set to about 0.5 μm at the maximum, and the application is performed in several steps until the desired concentration is achieved. Thereby, the strength of the coating film can be improved.

In a case where the crucible is only simply heated when spraying the coating liquid, the coating film tends to become patchy, and it is difficult to form a dense and uniform coating film. However, by controlling the coating conditions as described above, a dense and uniform coating film can be formed, and the peel strength of the coating film can be improved.

Figure 6:
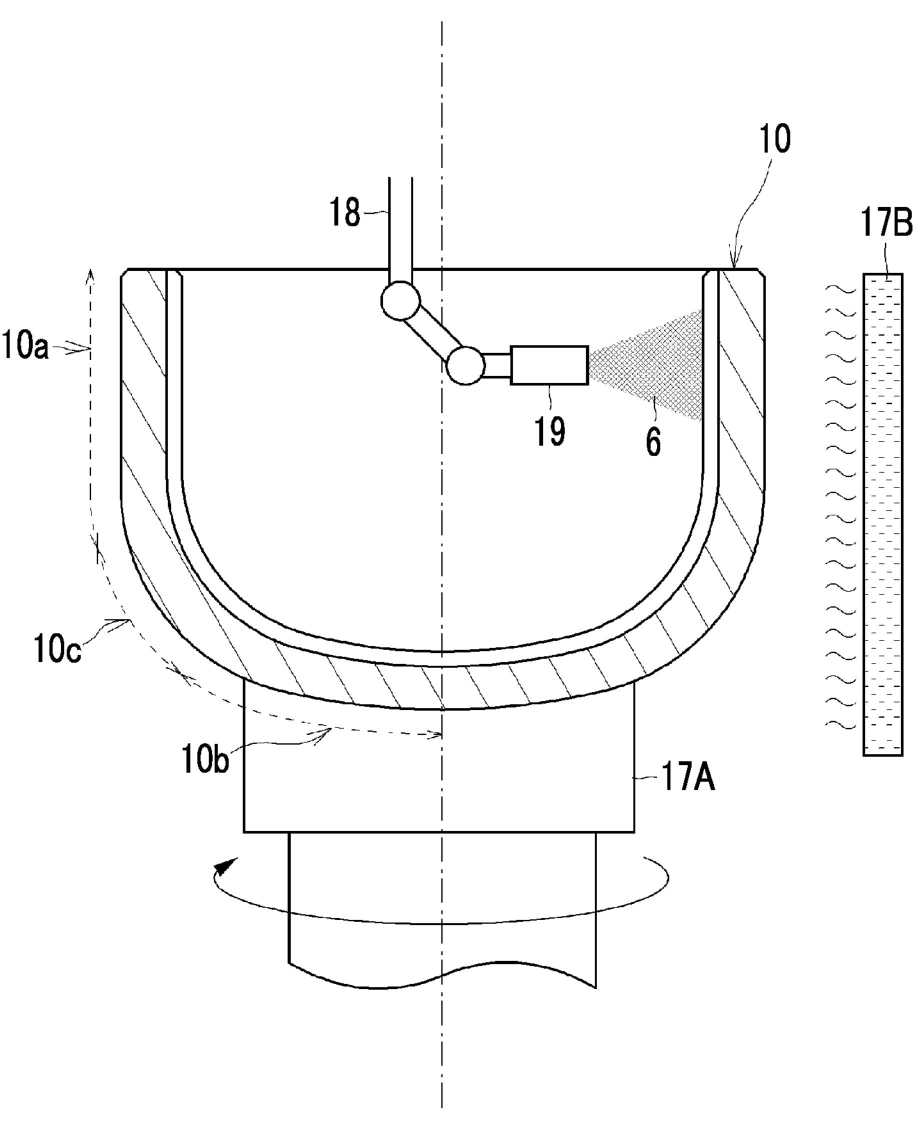
FIG. 6 is a schematic diagram illustrating a method of applying a crystallization accelerator to the inner surface of a crucible base body.

FIG. 6 is a schematic diagram illustrating a method of applying the crystallization accelerator to the inner surface 10*i* of the crucible base body 10.

As shown in FIG. 6, in the application of the crystallization accelerator, the crucible base body 10 is placed on the rotary support 17A with the opening of the crucible base body 10 facing upward, and the coating liquid 6 is sprayed from the spray nozzle 19 attached to a distal end of the robot arm 18 installed inside the crucible base body 10. At this time, in order to prevent the liquid dripping of the coating liquid 6, it is preferable to install a heater 17B outside the crucible base body 10 and apply while heating the crucible base body 10 to 60° C. to 500° ° C., and particularly preferably 100° ° C. to 180° C. In a case where the surface temperature of the crucible base body 10 is 60° C. or more, the solvent instantly evaporates on the surface of the crucible base body 10, and thus the crystallization accelerator can be uniformly fixed on the inner surface 10*i* of the crucible base body 10.

In a case where the crystallization accelerator is a hydroxide of metal, it reacts with carbon dioxide gas in the atmosphere to form a carbonate. For example, 2.5% of barium hydroxide becomes barium carbonate in the atmosphere and normal pressure. The carbonate in the coating film 13 causes an increase in the carbon concentration of the silicon single crystal. In order to suppress the formation of such carbonates, the surface temperature of the crucible when applying the crystallization accelerator is set preferably to 500° C. or less and particularly preferably to the boiling point of the solvent or more and 80° C. or less. Thereby, the weight ratio of the carbonate in the total weight of the coating film can be suppressed to 20.0 w % or less.

Figure 7:
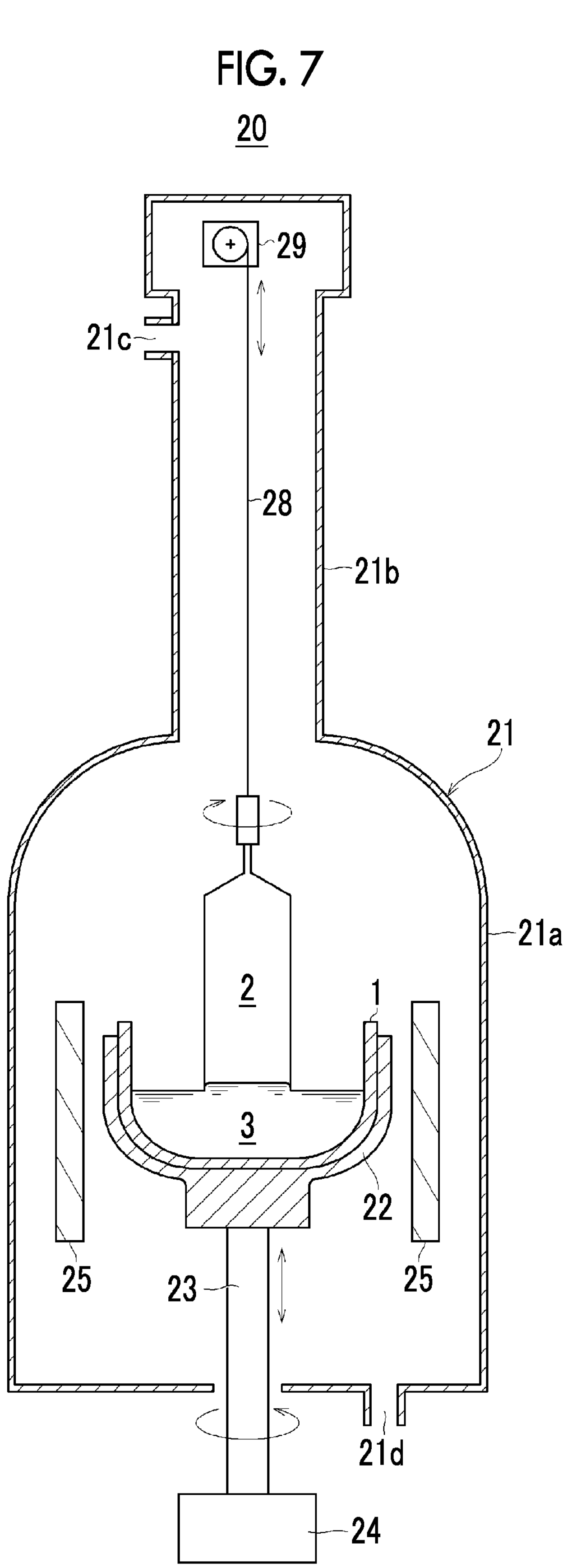
FIG. 7 is a diagram for explaining a single crystal pulling up step using the quartz glass crucible according to the present embodiment, and is a schematic sectional view illustrating a configuration of a single crystal pulling apparatus.

FIG. 7 is a diagram for explaining a single crystal pulling up step using the quartz glass crucible 1 according to the present embodiment, and is a schematic sectional view illustrating the configuration of a single crystal pulling apparatus.

As shown in FIG. 7, a single crystal pulling apparatus 20 is used for the pulling up step of a silicon single crystal by the CZ method. The single crystal pulling apparatus 20 includes a water-cooled chamber 21, a quartz glass crucible 1 holding a silicon melt in the chamber 21, a carbon susceptor 22 holding the quartz glass crucible 1, a rotating shaft 23 supporting the carbon susceptor 22 to be capable of rotation and elevation, a shaft driving mechanism 24 that rotates and elevation-drives the rotating shaft 23, a heater 25 that is arranged around the carbon susceptor 22, a single crystal pulling-up wire 28 that is arranged above the quartz glass crucible 1 and on the same axis with the rotating shaft 23, and a wire winding mechanism 29 arranged above the chamber 21.

The chamber 21 is configured by a main chamber 21*a* and a slender cylindrical pull chamber 21*b* which is connected to an upper opening of the main chamber 21*a*. The quartz glass crucible 1, the carbon susceptor 22, and the heater 25 are provided in the main chamber 21*a*. A gas entry 21*c* for introducing inert gas (purge gas) such as argon gas or a dopant gas into the main chamber 21*a* is provided in the upper portion of the pull chamber 21*b*, and a gas outlet 21*d* for discharging atmospheric gas inside the main chamber 21*a* is provided in the lower portion of the main chamber 21*a*.

The carbon susceptor 22 is used to maintain the shape of the quartz glass crucible 1 which is softened at high temperature, and holds the quartz glass crucible 1 to wrap around it. The quartz glass crucible 1 and the carbon susceptor 22 configure a double-structured crucible that supports the silicon melt in the chamber 21.

The carbon susceptor 22 is fixed to the upper end of the rotating shaft 23, and the lower end of the rotating shaft 23 passes through the bottom of the chamber 21 and is connected to a shaft driving mechanism 24 provided outside of the chamber 21.

The heater 25 is used to melt the polycrystalline silicon raw material filled in the quartz glass crucible 1 to generate the silicon melt 3, as well as to keep a molten state of the silicon melt 3. The heater 25 is a resistance heating type carbon heater, and is provided surrounding the quartz glass crucible 1 in the carbon susceptor 22.

Although the amount of the silicon melt in the quartz glass crucible 1 decreases as a silicon single crystal 2 grows, the quartz glass crucible 1 is raised such that the height of the melt surface is constant.

The wire winding mechanism 29 is arranged above the pull chamber 21*b*, the wire 28 extends downward from the wire winding mechanism 29 passing through the interior of the pull chamber 21*b*, and a distal end of the wire 28 reaches the inner space of the main chamber 21*a*. This figure shows a state in which the silicon single crystal 2 in the middle of growth is suspended on the wire 28. When the silicon single crystal 2 is pulled up, the wire 28 is gradually pulled up while rotating the quartz glass crucible 1 and the silicon single crystal 2 individually to grow the silicon single crystal 2.

During the single crystal pulling up step, the inner surface of the crucible crystallizes, and the crystallization of the inner surface of the crucible advances uniformly by the action of the crystallization accelerator, and thus dislocations in the silicon single crystal due to peeling of brown rings can be prevented. In addition, the quartz glass crucible 1 is softened, but the crystallization of the inner surface of the crucible advances uniformly, and thus the strength of the crucible can be secured and deformation can be suppressed. Therefore, contacting with members in a furnace due to deformation of the crucible or changing of a position of the melt surface of the silicon melt 3 due to the change of the volume in the crucible can be prevented.

As described above, the quartz glass crucible 1 according to the present embodiment includes the crucible base body 10 consisting of silica glass and the coating film 13 of the crystallization accelerator formed on the inner surface 10*i* of the crucible base body 10. In the crucible, both of the average carbon concentration in the coating film 13 and the average carbon concentration in the crucible base body within the range of 0 μm to 300 μm in depth from the inner surface of the crucible base body 10 are $1.0\times10^{12}$ atoms/cc or more and $3.0\times10^{19}$ atoms/cc or less, and thus it is possible to prevent carbon contamination in the silicon single crystal caused by the quartz glass crucible and to manufacture a high-quality silicon single crystal.

In addition, in the manufacturing method of a quartz glass crucible according to the present embodiment, silica powder having a carbon content of less than 6 ppm is prepared as a raw material in the vicinity of the inner surface of the crucible base body 10, and in a case where the silica powder is arc-melted to manufacture a quartz glass crucible, a carbon electrode having a bulk specific gravity of 1.50 g/cc to 1.75 g/cc and a specific resistivity of 330 μΩ·cm to 600 μΩ·cm is used, and thus the average carbon concentration in the crucible base body within the range of 0 μm to 300 μm in depth from the inner surface of the crucible base body 10 can be suppressed to $3.0\times10^{19}$ atoms/cc or less. Therefore, carbon contamination in the silicon single crystal derived from the quartz glass crucible can be prevented.

In addition, in the manufacturing method of a quartz glass crucible according to the present embodiment, when the coating liquid containing the crystallization accelerator is sprayed onto the inner surface of the crucible base body 10, the coating liquid is sprayed using the two-fluid nozzle such that the average droplet diameter is 5 μm or more and 1,000 μm or less, furthermore, the maximum thickness of the coating film formed by one application is 0.5 μm or less, and the coating film is formed into multiple layers by alternately repeating drying of the coating film and reapplying until the desired carbon concentration is achieved, thereby the coating film 13 having a low carbon concentration can be formed.

Although preferred embodiments of the present invention were described above, the present invention is not limited to the above-described embodiments, and various modifications are possible without departing from the scope of the present invention, and such modifications are, needless to say, covered by the scope of the present invention.

For example, in the above-described embodiment, the inner surface 10*i* of the crucible base body 10 is covered with the coating film 13 of the crystallization accelerator, and the outer surface 100 is not covered with the coating film, but both of the inner surface 10*i* and the outer surface 100 may be covered with the coating film of the crystallization accelerator. That is, the coating film of the crystallization accelerator may cover at least the inner surface 10*i* of the crucible base body 10. Furthermore, the coating film 13 does not necessarily need to be formed on the entire inner surface of the crucible base body excluding the vicinity of the upper end of the rim, and the coating film on the inner surface of the sidewall 10*a* may be omitted. That is, the coating film 13 may be provided at least on the inner surface of the bottom central region (within a range of 0.5 r from the center of the bottom) of the crucible base body 10.

In the above-described embodiment, the crucible base body 10 is facing upward when the coating liquid is sprayed onto the inner surface of the crucible base body 10, but for example, the coating liquid can be applied in a state where the crucible base body is turned upside down to face downward. Furthermore, the heating of the crucible base body 10 may be performed while applying the crystallization accelerator, the application may be performed after preheating the crucible base body 10, or when applying the crystallization accelerator after preheating the crucible base body 10, in order to prevent the temperature of the crucible base body 10 from abruptly dropping during the coating step, the application of the crystallization accelerator can be performed while continuously heating the crucible using a heater different from that for preheating.

Examples

<Evaluation of Carbon Concentration in Vicinity of Inner Surface of Crucible>

A crucible base body configuring a 32-inch quartz glass crucible was produced by a rotational molding method. In the production of the quartz glass crucibles according to Examples 1 to 5, quartz powder having a carbon content of less than 6 ppm were used as the raw material for the inner surface of the crucible. On the other hand, in the production of the quartz glass crucibles according to Comparative Examples 1 to 4, quartz powder having a carbon content of 6 ppm or more were used as the raw material for the inner surface of the crucible. The carbon content of the quartz powder was measured by the "high-frequency combustion-infrared absorption method".

A carbon electrode having a bulk specific gravity of 1.50 g/cc to 1.75 g/cc and a specific resistivity of 330 μΩ·cm to 600 μΩ·cm was used during arc melting of quartz powder. In the crucible base body, a transparent layer was formed by evacuating the raw material powder from outside of the rotating mold supporting the raw material powder during melting on the inner surface side, and then a bubble layer was formed by stopping the evacuation or weakening the suction force.

Next, the rim portion of the crucible base body was cut, the crucible base body was cleaned with a cleaning liquid and rinsed with pure water, and then a crystallization accelerator was applied to the inner surface of the crucible. The cleaning liquid was prepared by diluting hydrofluoric acid of semiconductor grade with pure water of TOC≤2 ppb (17.2 MΩ or more, 15 to 25° C.) to adjust to 10 to 40 w %. An aqueous solution of barium hydroxide was used as the crystallization accelerator, and was uniformly applied by a spray method. The crucible base body was heated with a halogen heater when applying the crystallization accelerator, and the application was performed while measuring the surface temperature of the crucible.

A two-fluid nozzle was used for spraying the crystallization accelerator, and the thickness of the coating film of the crystallization accelerator formed by one application was about 0.5 μm, and the application was repeated until the desired concentration (film thickness of about 10 μm) was achieved. In this way, as shown in Table 1, a quartz glass crucible having a coating film of a crystallization accelerator formed on the inner surface of the crucible base body was completed.

Next, the average carbon concentration and average nitrogen concentration on the inner surface of the quartz glass crucibles according to Comparative Examples 1 to 4 and multi-pulling up was three, and the same crystal pulling up conditions were used. The carbon concentration (relative value) of the third silicon single crystal thus pulled up, the number of pinhole formation in the silicon single crystals, and the yield of the silicon single crystals (dislocation-free rate) were determined. The yield of the single crystals is the weight ratio of the single crystal to the polycrystalline raw material. Table 1 shows the results.

The evaluation of the carbon concentration of the silicon single crystal was performed on the third silicon single crystal of the multi-pulling up, in which the increase in carbon concentration due to segregation is remarkable. All three silicon single crystals were targeted for the evaluation of pinholes and the yield of silicon single crystals. The evaluation of the roughened inner surface is an evaluation of the area occupancy of the uneven portion where the brown ring is peeled and the silica glass is exposed. “High” indicates 50% or more, “Moderate” indicates 20% or more and less than 50%, and “Low” indicates less than 20%. In the evaluation of pinholes, the total number of wafers obtained by processing three silicon single crystals obtained by multi-pulling up was used as the population parameter, and the ratio of the number of wafers in which pinholes are found was determined as the rate of pinhole formation. “Low” indicates less than 0.1% of the rate of pinhole formation and “High” indicates 0.1% or more thereof.

TABLE 1

| | Quartz glass crucible | | | | | | | Silicon single crystal | | |
|---|---|---|---|---|---|---|---|---|---|---|
| | Number of multi-pulling | Application of crystallization accelerator | Average carbon concentration of surface (atoms/cc) | Variation coefficient of carbon concentration (σ/average) | Average nitrogen concentration of surface (atoms/cc) | Surface temperature of crucible when applying (° C.) | Roughened inner surface | Carbon concentration (relative value) | Pinhole formation | Yield of single crystal (%) |
| Comparative Example 1 | 3 | Yes | 1.2E+20 | 9.9 | 4.7E+16 | 50 | Moderate | 100 | High | 72.1 |
| Comparative Example 2 | 3 | Yes | 5.8E+19 | 3.7 | 7.1E+16 | 22 | High | 94 | High | 60.2 |
| Comparative Example 3 | 3 | Yes | 5.3E+20 | 0.1 | 4.1E+17 | 265 | Moderate | 98 | High | 75.0 |
| Comparative Example 4 | 3 | Yes | 5.7E+20 | 1.5 | 3.5E+17 | 300 | High | 96 | High | 70.6 |
| Example 1 | 3 | No | <1.0E+12 | | 4.7E+16 | | Low | 82 | Low | 85.0 |
| Example 2 | 3 | Yes | 1.3E+16 | 0.2 | 3.1E+17 | 250 | Low | 82 | Low | 81.2 |
| Example 3 | 3 | Yes | 3.0E+19 | 0.6 | 4.7E+17 | 250 | Low | 86 | Low | 83.5 |
| Example 4 | 3 | Yes | 5.2E+14 | 0.4 | 1.7E+17 | 242 | Low | 80 | Low | 87.0 |
| Example 5 | 3 | Yes | 1.4E+12 | 1.1 | 6.6E+16 | 170 | Low | 79 | Low | 88.5 |

Examples 1 to 5 were measured, and furthermore, the variation coefficient (σ/AVERAGE) of the carbon concentration was determined. Carbon concentration and nitrogen concentration were measured by D-SIMS (Dynamic-Secondary Ion Mass Spectrometry). For the D-SIMS measurement, a crucible sample having a size of 10 mm×10 mm×5 mm cut from the inner surface of the quartz glass crucible was used. The variation coefficient of the carbon concentration was obtained from the carbon concentrations at five points consisting of one point at the center of the bottom of the crucible and four points that were 0.2r (r is the radius of the crucible outer diameter) away from the center in four directions (X and Y directions).

After that, multi-pulling up of silicon single crystals by the CZ method was performed using other crucible samples having the same properties and manufactured under the same conditions as the quartz glass crucibles of Comparative Examples 1 to 4 and Examples 1 to 5. The number of As shown in Table 1, the average carbon concentration on the inner surface of the quartz glass crucible according to Comparative Example 1 was $1.2\times10^{20}$ atoms/cc, the variation coefficient of the carbon concentration was 2.2, and the average nitrogen concentration was $4.7\times10^{16}$ atoms/cc. The surface temperature of the crucible when applying the crystallization accelerator was 50° C. In a case where the pulling up of the silicon single crystal was performed using another crucible sample having the same properties and manufactured under the same conditions as this crucible sample, the surface roughening of the inner surface of the used crucible was moderate. The carbon concentration of the silicon single crystal pulled up using the quartz glass crucible was determined and used as the reference value for the carbon concentration of subsequent silicon single crystals. Many pinholes were observed in this silicon single crystal. The yield of the silicon single crystal was 72.1%, which was a result lower than 80%.

The average carbon concentration on the inner surface of the quartz glass crucible according to Comparative Example 2 was $5.8\times10^{19}$ atoms/cc, the variation coefficient of the carbon concentration was 1.8, and the average nitrogen concentration was $7.1\times10^{16}$ atoms/cc. The surface temperature of the crucible when applying the crystallization accelerator was 22° C. In a case where the pulling up of the silicon single crystal was performed using another crucible sample having the same properties and manufactured under the same conditions as this crucible sample, the surface roughening of the inner surface of the used crucible was high. The carbon concentration (relative value) of the silicon single crystal pulled up using the quartz glass crucible was 94. Many pinholes were observed in this silicon single crystal. The yield of the silicon single crystal was 60.2%, which was a result lower than 80%.

The average carbon concentration on the inner surface of the quartz glass crucible according to Comparative Example 3 was $5.3\times10^{19}$ atoms/cc, the variation coefficient of the carbon concentration was 1.2, and the average nitrogen concentration was $4.1\times10^{17}$ atoms/cc. The surface temperature of the crucible when applying the crystallization accelerator was 265° C. In a case where the pulling up of the silicon single crystal was performed using another crucible sample having the same properties and manufactured under the same conditions as this crucible sample, the surface roughening of the inner surface of the used crucible was moderate. The carbon concentration (relative value) of the silicon single crystal pulled up using the quartz glass crucible was 98. Many pinholes were observed in this silicon single crystal. The yield of the silicon single crystal was 75.0%, which was a result lower than 80%.

The average carbon concentration on the inner surface of the quartz glass crucible according to Comparative Example 4 was $5.7\times10^{20}$ atoms/cc, the variation coefficient of the carbon concentration was 1.5, and the average nitrogen concentration was $3.5\times10^{17}$ atoms/cc. The surface temperature of the crucible when applying the crystallization accelerator was 300° C. In a case where the pulling up of the silicon single crystal was performed using another crucible sample having the same properties and manufactured under the same conditions as this crucible sample, the surface roughening of the inner surface of the used crucible was high. The carbon concentration (relative value) of the silicon single crystal pulled up using the quartz glass crucible was 96. Many pinholes were observed in this silicon single crystal. The yield of the silicon single crystal was 70.6%, which was a result lower than 80%.

The quartz glass crucible according to Example 1 was not coated with a crystallization accelerator on its inner surface. The average carbon concentration on the inner surface of this quartz glass crucible was less than $1.0\times10^{12}$ atoms/cc and the average nitrogen concentration was $4.7\times10^{16}$ atoms/cc. In a case where the pulling up of the silicon single crystal was performed using another crucible sample having the same properties and manufactured under the same conditions as this crucible sample, the surface roughening of the inner surface of the used crucible was low. The carbon concentration (relative value) of the silicon single crystal pulled up using the quartz glass crucible was 82. In addition, the number of pinholes in the silicon single crystal was small. The yield of the silicon single crystals was 85%, which was a good result exceeding 80%.

The average carbon concentration on the inner surface of the quartz glass crucible according to Example 2 was less than $1.3\times10^{16}$ atoms/cc, the variation coefficient of the carbon concentration was 0.2, and the average nitrogen concentration was $3.1\times10^{17}$ atoms/cc. The surface temperature of the crucible when applying the crystallization accelerator was 250° C. In a case where the pulling up of the silicon single crystal was performed using another crucible sample having the same properties and manufactured under the same conditions as this crucible sample, the surface roughening of the inner surface of the used crucible was low. The carbon concentration (relative value) of the silicon single crystal pulled up using the quartz glass crucible was 82. In addition, the number of pinholes in the silicon single crystal was small. The yield of the silicon single crystals was 81.2%, which was a good result exceeding 80%.

The average carbon concentration on the inner surface of the quartz glass crucible according to Example 3 was less than $3.0\times10^{19}$ atoms/cc, the variation coefficient of the carbon concentration was 0.6, and the average nitrogen concentration was $4.7\times10^{17}$ atoms/cc. The surface temperature of the crucible when applying the crystallization accelerator was 250° C. In a case where the pulling up of the silicon single crystal was performed using another crucible sample having the same properties and manufactured under the same conditions as this crucible sample, the surface roughening of the inner surface of the used crucible was low. The carbon concentration (relative value) of the silicon single crystal pulled up using the quartz glass crucible was 86. In addition, the number of pinholes in the silicon single crystal was small. The yield of the silicon single crystals was 83.5%, which was a good result exceeding 80%.

The average carbon concentration on the inner surface of the quartz glass crucible according to Example 4 was less than $5.2\times10^{14}$ atoms/cc, the variation coefficient of the carbon concentration was 0.4, and the average nitrogen concentration was $1.7\times10^{17}$ atoms/cc. The surface temperature of the crucible when applying the crystallization accelerator was 242° C. In a case where the pulling up of the silicon single crystal was performed using another crucible sample having the same properties and manufactured under the same conditions as this crucible sample, the surface roughening of the inner surface of the used crucible was low. The carbon concentration (relative value) of the silicon single crystal pulled up using the quartz glass crucible was 80. In addition, the number of pinholes in the silicon single crystal was small. The yield of the silicon single crystals was 87.0%, which was a good result exceeding 80%.

The average carbon concentration on the inner surface of the quartz glass crucible according to Example 5 was less than $1.4\times10^{12}$ atoms/cc, the variation coefficient of the carbon concentration was 1.1, and the average nitrogen concentration was $6.6\times10^{16}$ atoms/cc. The surface temperature of the crucible when applying the crystallization accelerator was 170° C. In a case where the pulling up of the silicon single crystal was performed using another crucible sample having the same properties and manufactured under the same conditions as this crucible sample, the surface roughening of the inner surface of the used crucible was low. The carbon concentration (relative value) of the silicon single crystal pulled up using the quartz glass crucible was 79. In addition, the number of pinholes in the silicon single crystal was small. The yield of the silicon single crystals was 88.5%, which was a good result exceeding 80%.

<Evaluation of Heating Temperature of Crucible>

The crucible base body was preheated with a halogen heater, and then the application of the crystallization accelerator was performed on the inner surface of the crucible base body. When applying the crystallization accelerator, the inner surface temperature of the crucible at the application position was measured with a radiation thermometer in a noncontact manner. The weight ratio of the carbonate contained in the coating film of the crystallization accelerator of the quartz glass crucible thus obtained was measured by the XPS method and the Raman measurement method. Table 2 shows the results.

TABLE 2

| Surface temperature of crucible when heating and applying (° C.) | Weight ratio of carbonate (w %) |
|---|---|
| 20 | 0.0 |
| 180 | 1.2 |
| 250 | 2.5 |
| 500 | 20.0 |

As shown in Table 2, in a case where the surface temperature of the crucible was 20° C., liquid dripping of the coating liquid occurred on the coating surface. On the other hand, in a case where the surface temperature of the crucible was 60° C. or more, liquid dripping did not occur and the solvent could be instantly evaporated.

In addition, as can be seen from Table 2, in a case where the surface temperature of the crucible is 250° C. or less, the weight ratio of the carbonate is 2.5 w % or less, whereas in a case where the surface temperature of the crucible is 500° C., the weight ratio of the carbonate is 20 w %, and the weight ratio of the carbonate was significantly increased. It was found that in order to reduce the carbon concentration in the coating film, the inner surface temperature of the crucible base body should be 500° C. or less when applying the crystallization accelerator.

DESCRIPTION OF REFERENCE NUMERALS

1 Quartz glass crucible
1*s* Crucible sample
2 Silicon single crystal
3 Silicon melt
6 Coating liquid
10 Crucible base body
10*a* Sidewall
10*b* Bottom
10*c* Corner
10*i* Inner surface of crucible base body
100 Outer surface of crucible base body
11 Transparent layer
12 Bubble layer
13 Coating film of crystallization accelerator
14 Mold
14*a* Vent hole
14*i* Inner surface of mold
15 Arc electrode
16 Deposited layer of quartz powder
16*a* Natural quartz powder
16*b* Synthetic quartz powder
17A Rotary support
17B Heater
18 Robot arm
19 Spray nozzle
20 Single crystal pulling apparatus
21 Chamber
21*a* Main chamber
21*b* Pull chamber
21*c* Gas entry
21*d* Gas outlet
22 Carbon susceptor
23 Rotating shaft
24 Shaft driving mechanism
25 Heater
28 Single crystal pulling-up wire
29 Wire winding mechanism
30 SAICAS
31 Diamond blade

The invention claimed is:

1. A quartz glass crucible comprising:

a crucible base body consisting of silica glass; and a coating film containing a crystallization accelerator and formed on an inner surface of the crucible base body, wherein:

the coating film has an average carbon concentration of $1.0\times10^{12}$ atoms/cc or more and $3.0\times10^{19}$ atoms/cc or less, the crucible base body at a depth from 0 μm to 300 μm from the inner surface of the crucible base body has an average carbon concentration of $1.0\times10^{12}$ atoms/cc or more and $3.0\times10^{19}$ atoms/cc or less, a variation coefficient (σ/AVERAGE) of a carbon concentration in the coating film at five points on a bottom of the crucible base body is 1.1 or less, and the five points are determined as:

a first measurement point that is a center of the bottom, a second measurement point that is a position shifted by 0.08 to 0.7 times a radius in a radial direction of the crucible base body from the first measurement point, a third measurement point that is a position rotated 90° clockwise in a circumferential direction from the second measurement point, a fourth measurement point is a position rotated 90° clockwise in the circumferential direction from the third measurement point, and a fifth measurement point that is a position rotated 90° clockwise in the circumferential direction from the fourth measurement point.

2. The quartz glass crucible according to claim 1, wherein a weight ratio of a carbonate in the coating film is 20.0 w % or less.

3. The quartz glass crucible according to claim 1, wherein the average carbon concentration in the coating film is $1.0\times10^{12}$ atoms/cc or more and $3.0\times10^{18}$ atoms/cc or less.

4. The quartz glass crucible according to claim 1, wherein;

the average carbon concentration in the coating film is $1.0\times10^{12}$ atoms/cc or more and $1.3\times10^{16}$ atoms/cc or less, and the average carbon concentration in the crucible base body at the depth from 0 μm to 300 μm from the inner surface of the crucible base body is $1.0\times10^{12}$ atoms/cc or more and $1.3\times10^{16}$ atoms/cc or less.

5. The quartz glass crucible according to claim 1, wherein the coating film has a peel strength of 0.3 kN/m or more.

6. The quartz glass crucible according to claim 1, wherein:

the coating film has a nitrogen concentration of $4.7\times10^{17}$ atoms/cc or less, and the crucible base body at the depth from 0 μm to 300 μm from the inner surface of the crucible base body has a nitrogen concentration of $4.7\times10^{17}$ atoms/cc or less.

7. A manufacturing method of a silicon single crystal, comprising pulling up a silicon single crystal using the quartz glass crucible according to claim 1.

* * * * *